May 25, 1965 S. B. FULLER 3,185,936

DYNAMIC RANGE MODIFIER

Filed Dec. 8, 1961 2 Sheets-Sheet 1

Steven B. Fuller,
Inventor,
Koenig, Pope, Senniger and Powers,
Attorneys.

United States Patent Office 3,185,936
Patented May 25, 1965

3,185,936
DYNAMIC RANGE MODIFIER

Steven B. Fuller, 226 Spring Ave., Webster Groves 19, Mo.

Filed Dec. 8, 1961, Ser. No. 158,079
11 Claims. (Cl. 330—59)

This invention relates to apparatus for modifying the dynamic range of electrical signals, and more particularly to apparatus which will increase or decrease the dynamic range of electrical signals.

Among the several objects of this invention may be noted the provision of apparatus for increasing or expanding the dynamic range of electrical signals; the provision of apparatus for decreasing or compressing the dynamic range of electrical signals; the provision of dynamic range modifying apparatus for selectively compressing or expanding the dynamic range of electrical signals, and in which the amount of compression or expansion is controllable over a continuous range of values; the provision of such apparatus which operates in the audio-frequency range and which may be employed in existing audio-frequency amplifying systems; and the provision of a dynamic range modifying network which is inexpensive, easily constructed, and reliable in operation. Other objects and features will be in part apparent and in part pointed out hereinafter.

The invention accordingly comprises the constructions hereinafter described, the scope of the invention being indicated in the following claims.

In the accompanying drawings, in which several of various possible embodiments of the invention are illustrated, FIG. 1 is a schematic diagram of one embodiment of the dynamic range modifying apparatus of the present invention;

Corresponding reference characters indicate corresponding parts throughout the drawings.

Figure 5:
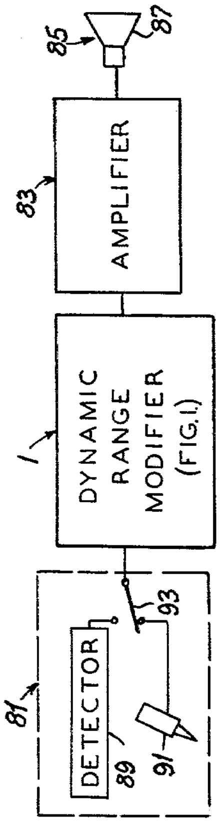
FIG. 5 is a block diagram of an audio system employing the dynamic range modifier of FIG. 1, illustrating one possible interconnection.

There are many instances in which it is necessary or desirable to modify the dynamic range of an electrical signal, particularly an audio-frequency electrical signal. In the recording of audio-frequency signals, for example, because of the limited amplitude range which may be recorded on either tape or a recording disc, it is often necessary to compress or diminish the dynamic range of these signals before the recording thereof. Similarly, to avoid over-modulation in radio transmitters, devices are often employed to compress or decrease the dynamic range of the modulating signals. In these instances, the signals to be recorded or transmitted are fed through a compressor, i.e., a device which has an effective gain which varies as a function of the amplitude of the input signal, this gain being greater for small than for large signals. Because of the use of compressors in recording and transmitting systems, a complementary modification in the amplitude range of the received or played-back signals is desirable to restore the dynamic range of the original signals. Expanders, i.e., devices having a higher gain for high amplitude signals than for low amplitude signals, are employed for this purpose in receiving or play-back systems in which fidelity of reproduction is important. There are still other instances in which either compression or expansion of an audio signal is desirable. For example, a compressor may be included in a play-back system to provide background music having neither very loud nor very soft passages. Or an expander may be provided to accentuate loud passages over soft passages to thus enliven a dull recording. To achieve the desired effect or optimize fidelity, the amount of compression or expansion should be readily controllable.

The present invention relates to apparatus for modifying the dnyamic range of an electrical signal which may be employed either as a compressor or an expander and in which the amount of compression or expansion brought about is controllable over a continuous range of values. The dynamic range modifier of this invention is an inexpensive, easily constructed component which may be utilized in conjunction with existing audio-frequency amplifying systems or which may be incorporated as an integral unit in new equipment of this type.

Briefly, the invention comprises an electrical circuit having input and output terminals and through which an electrical signal is conducted. Connected in this circuit as one of its components is a light sensitive resistor, for example, a photocell. This resistor has a resistance which varies as a function of luminous energy impinging thereon. To cause this resistance to vary as a function of the amplitude level of the input signal, and to thus cause the conductivity of the electrical circuit in which it is connected to so vary, the light sensitive resistor is positioned in light receiving relationship with a source of luminous energy energized by a control circuit as a function of this amplitude level. The light sensitive resistor may be connected into the electrical circuit in a first circuitry configuration wherein the low amplitude signals are attenuated more than higher amplitude signals, whereby the electrical circuit functions as an expander. Or the connection may be such that low amplitude signals are attenuated less than higher amplitude signals, in which case the electrical circuit functions as a compressor. Preferably, the light sensitive resistor is connected into the electrical circuit by a switch having first and second positions wherein the electrical circuit functions to either compress or expand the dynamic range of an input signal, depending upon the position of this switch. A variable element in the control circuit which energizes the source of luminous energy may be provided to permit an adjustment over a continuous range in the amount or degree of the compression or expansion brought about.

Figure 1:
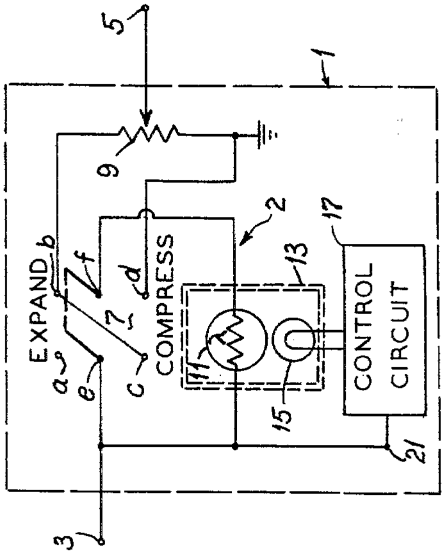

Referring now to the drawings, and more particularly to FIG. 1, the dynamic range modifying apparatus of this invention, enclosed within block 1, includes an electrical circuit or resistor network, indicated generally at reference numeral 2, having an input circuit including an input terminal 3 and an output circuit including an output terminal 5. In this embodiment the other input and output terminals are constituted by the ground connections. This circuit includes a double-pole, double-throw switch 7, having terminals *a* through *e*, a potentiometer 9 which constitutes an output resistance, and a light sensitive resistor 11. This light sensitive resistor 11 has a resistance which varies in accordance with the amount of luminous energy impinging thereon and is preferably, although not necessarily, a cadmium sulfide photocell having a resistance of several megohms in total darkness which drops to a few hundred ohms under conditions of high illumination. Resistor 11 is enclosed within a light-tight housing 13 in light receiving relationship with a source of luminous energy 15, connected to and energized by a control circuit 17. Light source 15 radiates luminous energy, of either ultraviolet, infrared or visible wave-lengths. It may be, for example, a small incandescent, filament type lamp such as a No. 47 pilot light. Electrical circuit 2, light-tight housing 13 and control circuit 17 are preferably mounted on a single chassis.

Figure 3:
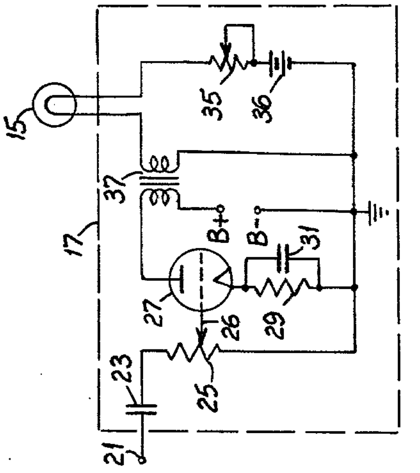
FIG. 3 is a schematic diagram illustrating a second embodiment of this control circuit.
Figure 2:
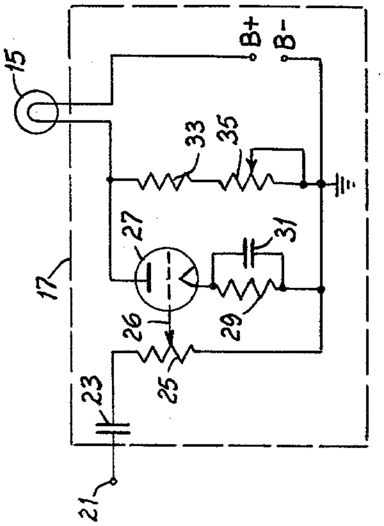
FIG. 2 is a schematic diagram illustrating one embodiment of the control circuit of the FIG. 1 apparatus.
Figure 4:
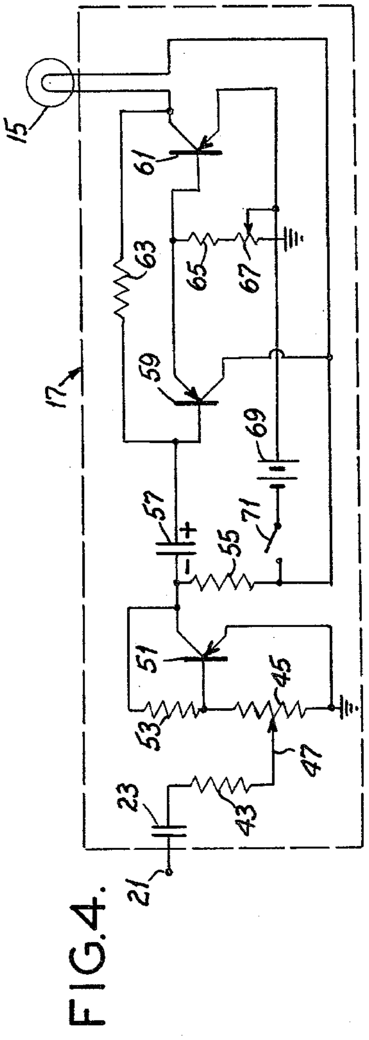
FIG. 4 is a schematic diagram of a transistor embodiment of this control circuit.

Control circuit 17 is connected to input terminal 3 at a point 21, and energizes light source 15 in accordance with the amplitude of electrical signals appearing at this input 3. Various embodiments of control circuit 17 are illustrated in FIGS. 2, 3 and 4. In FIG. 2, a vacuum tube embodiment is shown as including an input circuit (terminal 21 and ground) coupling capacitor 23, and an adjustable resistance or potentiometer 25. The movable arm 26 of potentiometer 25 is connected to the grid of a triode 27. Connected between the cathode of this triode and ground is a biasing resistor 29 and a by-pass capacitor 31. The source of luminous energy 15 is interconnected across the output circuit of control 17, i.e., between the positive terminal of a D.C. power source (B+) and the anode of tube 27. The negative terminal of this source (B—) is grounded. A fixed resistor 33 and an adjustable resistance or rheostat 35 complete a parallel circuit between this anode and ground. Triode 27 is normally non-conducting so that in the absence of an input signal at terminal 21, the only circuit between B+ and ground is through light source 15, resistor 33, and adjustable resistor 35. Resistor 35 controls the amount of current in this circut which in turn determines the bias or threshold illumination level of light source 15. The application of an input signal to terminal 21 causes tube 27 to conduct, increasing the current through light source 15 as a function of the amplitude of this input signal. Because the amount of threshold current through source 15 is controllable by rheostat 35, a desirable operating region on the operating curve of the light sensitive resistor 11 may be selected by the adjustment of the rotor of resistance 35. Triode 27 functions as an amplifier to increase this current in accordance with the amplitude of the signal applied at input 21. The current through source 15 is also controlled by the setting of movable arm 26 of resistance 25. Adjustment of this arm varies the intensity of the light radiated by source 15 by varying the amplitude of the signal applied to the grid of tube 27 and hence the conductivity of this tube. The intensity of the radiated luminous energy is accordingly controlled both in accordance with the amplitude of the signal applied at input terminal 21 and in accordance with the positioning of wiper arm 26, with the threshold illumination level or bias being determined by the adjustment of variable resistor 35.

A second vacuum tube embodiment of the control circuit 17, similar to that illustrated in FIG. 2, is shown in FIG. 3 with like elements being designated by the same reference numerals. In this circuit, a source of D.C. power 36 is provided to furnish a threshold current through light source 15. Again this current is controlled by a variable resistor 35. Source 15 is connected in this embodiment in the output circuit of tube 27 by a step-down transformer 37. As in the FIG. 2 circuit, the current through light source 15 is controlled in accordance with the amplitude of an input signal applied at input 21 and the position of arm 26, with the setting of rheostat 35 determining the threshold illumination level.

A transistor embodiment of control circuit 17 is illustrated in FIG. 4. This circuit has an input circuit including terminal 21 and a coupling capacitor 23. To increase the input impedance of this circuit a resistor 43 having a value, for example, of 1 megohm is connected in series with capacitor 41. Included in the circuit is a variable resistance 45 having an adjustable arm 47 for controlling the amplitude of the signal applied to the base of a transistor 51, which constitutes a first amplifying stage. This stage includes a shunt feedback resistor 53. The output of this first stage is fed to a second amplifying stage constituted by a transistor 59 by resistor 55 and capacitor 57. The collector of transistor 59 is connected to and energizes the base of a power transistor 61, controlling the collector current therethrough. Light source 15 is energized by this collector current. The base of transistor 59 is connected to the collector of transistor 61 by a resistor 63. A fixed resistor 65 and a variable resistor 67 are connected in the base-emitter circuit of transistor 61. A D.C. power supply and biasing source 69, connected into the circuit by a "on-off" switch 71, provide a small collector current through transistor 61. As in FIGS. 2 and 3, this current determines the threshold illumination or bias level of light source 15 which may be varied by a variable resistor, and in this case, potentiometer 67. In the operation of this transistor embodiment, a signal applied at terminal 21 is variably attenuated by variable resistor 45, amplified by transistors 51 and 59, and applied to the base of power transistor 61. The collector current of transistor 61 and, hence, the intensity of the luminous energy radiated by source 15 are controlled, as in FIGS. 2 and 3, in accordance with the amplitude of this input signal and in accordance with the setting of arm 47. A threshold illumination level is controlled by a variable resistor 67.

Referring again to FIG. 1, because resistor 11 is connected in light receiving relationship with light source 15, the resistance thereof is varied in accordance with the intensity of luminous energy radiated by source 15. This resistor 11 is connected into circuit 2, across terminals *e* and *f* of switch 7, so that the conductivity of this circuit is also varied in accordance with this radiated luminous energy. Switch 7 has two positions, an "expand" position and a "compress" position. With this switch in the "expand" position, resistor 11 is placed in series with output potentiometer 9, the circuit from input terminal 3 to output terminal 5 being completed through resistor 11, terminal *f*, terminal *b*, and a controlled portion of the resistance of potentiometer 9. With switch 7 in the "compress" position, on the other hand, variable resistor 11 is connected in parallel with potentiometer 9 between the input terminal 3 and ground, one path from input 3 to ground including resistor 11, terminal *f* and terminal *d*; the other path comprising terminal *e*, terminal *c*, terminal *b*, and potentiometer 9. In the "expand" position, electrical circuit 2 functions to expand the dynamic range of input signals by attenuating low amplitude signals more than higher amplitude signals. With switch 7 in the "compress" position, circuit 2 attenuates high amplitude signals more than lower amplitude signals and thus compresses the dynamic range of input signals. In either position, the conductivity of circuit 1 can be adjusted by the positioning of the wiper arm of output resistance 9.

The operation of the apparatus of FIG. 1 is as follows: an electrical signal applied at input terminal 3 is conducted through and attenuated by resistance network 2. If the dynamic range of this signal is to be compressed, switch 7 is set in the "compress" position, placing light sensitive resistor 11 in parallel with resistor 9. For signals of small amplitude the intensity of the luminous energy radiated by light source 15 is low and the resistance of light sensitive resistor 11 relatively high. For signals of increasing amplitude, the intensity of the luminous energy radiated by source 15 is increased with the resulting lowering of the resistance of resistor 11. The placing of resistor 11 in shunt with output resistance 9, and the varying of this resistor 11 in accordance with the amplitude of input signals results in low amplitude input signals being attenuated less than higher amplitude signals.

The time constant of the dynamic range modifying device of the present invention is dependent on the characteristics and parameters of the light sensitive resistor 11 and the light source 15, as well as the bias or threshold level set by adjustment of rheostats 35 (FIG. 2 and 3) and 67 (FIG. 4). As a practical matter the time constant is quite small; the attack time being shorter than the decay time. For example, the attack time may be in the order of several or more milliseconds, while the decay time is usually somewhat longer.

Figure 7:
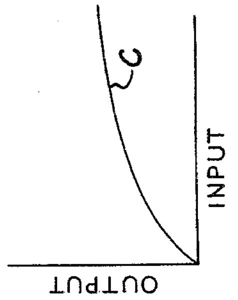
FIG. 7 is a graphic illustration of the transfer characteristics of the dynamic range modifying apparatus of FIG. 1 when operated in a compression mode.

An exemplary transfer characteristic of the circuit of FIG. 1 when operated in the compression mode is illustrated in FIG. 7 with the amplitude of the input signals being taken as the abscissa and the amplitude of output signals, the ordinate. If all of the components of circuit 2 were of fixed value, the output of this circuit would vary linearly with the input and the transfer characteristic would be a straight line whose slope would be indicative of the amount of fixed attenuation caused by the circuit. Because circuit 2 includes variable resistor 11, however, the output of this circuit does not vary linearly with the input. The gain of the circuit, as represented by the slope of curve C, decreases with increasing amplitude of input signals and the input signal is compressed. The amount or degree of compression brought about is controllable over a continuous range by the setting of the adjustable resistor (25 in FIGS. 2 and 3, 45 in FIG. 4) of control circuit 17. In one embodiment using a cadmium sulfide photocell as resistor 11, compression in the order of 8 db was achieved.

Figure 8:
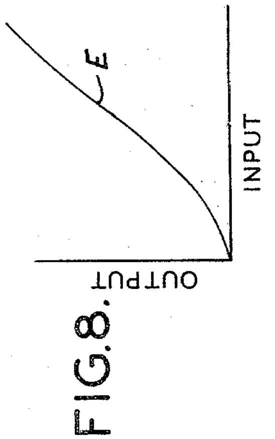
FIG. 8 is a graphic illustration of the transfer characteristics of the dynamic range modifying apparatus of FIG. 1 when operated in an expansion mode.

If the dynamic range of the input signals is to be expanded rather than compressed, switch 7 is moved to the "expand" position, placing light sensitive resistor 11 in series with resistor 9. Again for low amplitude signals the intensity of the luminous energy radiated by source 15 is low and the resistance of resistor 11, relatively high. Low amplitude signals passing through network 2 are thus attenuated by the relatively large resistance of resistor 11. Because this resistance decreases for increasing amplitude signals, higher amplitude signals are attenuated less than lower amplitude signals. Referring to FIG. 8 which illustrates an exemplary transfer characteristic of FIG. 1 when operated in the expansion mode, it is seen that the gain of circuit 2, as represented by the slope of curve E, increases as the input signal increases and the desired expansion obtained. Again in one embodiment employing a cadmium sulfide photocell as the light sensitive resistor, expansion in the order of 8 db was achieved.

The apparatus of FIG. 1 may be employed in any electrical system in which either the compression or expansion of the dynamic range of an input signal is to be brought about. It is particularly suitable for either expanding or compressing the dynamic range of an audio-frequency signal in audio-frequency amplifying systems. One such use is illustrated in FIG. 5 in which the dynamic range modifier of FIG. 1 is connected between a source of audio-frequency signals 81 and an audio amplifier 83. Amplifier 83 energizes a utilization means 85 such as a speaker system 87 and may be any conventional audio amplifier, preferably including both gain and tone controls. This amplifier may include both a preamplifier and a power amplifier, either on a single chassis or as two separate interconnected units. It is to be noted that potentiometer 9 is preferably to be utilized as the operational or principal volume or gain control of the system. However, the existing potentiometer gain control in the system may be utilized in place of potentiometer 9.

The source of audio signals 81 is illustrated as comprising a detector 89 of either an AM or FM receiver, a phonograph pick-up 91, and a selector switch 93 for selectively supplying the outputs of these two devices to the dynamic range modifier of FIG. 1. This modifier, as explained above, may either function to expand or compress the dynamic range of signals conducted from the source 81 to the amplifier 83.

Figure 6:
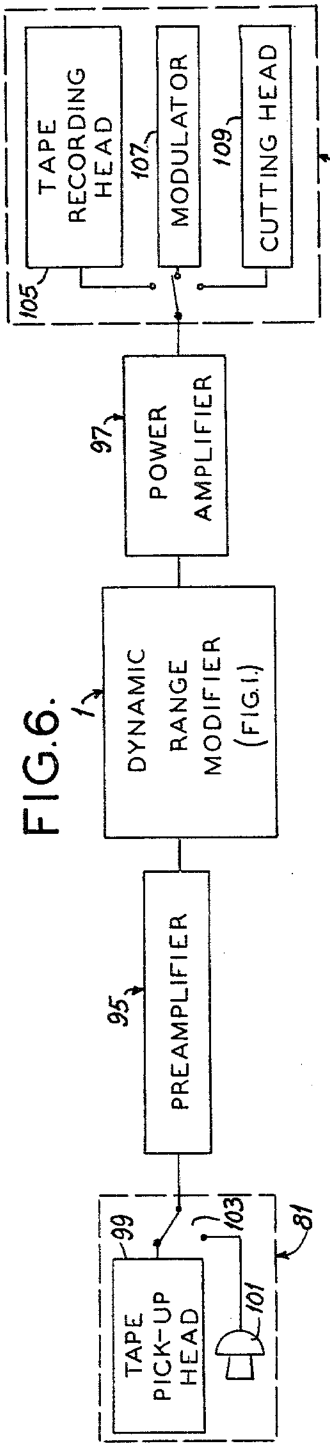
FIG. 6 is a similar block diagram of an audio system employing the dynamic range modifier of FIG. 1, illustrating a second possible interconnection.

A second use of the circuit of FIG. 1 in an audio-frequency amplifying system is illustrated in FIG. 6 where the dynamic range modifier 1 is connected between a preamplifier 95 and a power amplifier 97. The source of audio-frequency signals 81 in this embodiment is shown as comprising a tape pick-up head 99 and a microphone 101, selectively alternately connected to preamplifier 95 by switch 103. The utilization means 85 is illustrated as comprising a tape recording head 105, a modulator 107 of either an AM or FM transmitter, and a phonograph cutting head 109. The showing of various devices for both the source of audio-frequency signals 81 and the utilization means 85 in FIGS. 5 and 6 is to be interpreted as illustrative and not in a limiting sense. In FIG. 6, as in FIG. 5, the dynamic range modifier may serve to either compress or expand the dynamic range of signals fed from preamplifier 95 to power amplifier 97. With regard to FIG. 6 it should be noted that the input signals to the dynamic range modifier have been subjected to the controls, both gain and tone, of preamplifier 25. In many applications this may be undesirable since the dynamic range modifier would tend to accentuate the effect of these tone controls, and even accentuate the effects of nonlinearities in preamplifier 95. Thus, where tonal fidelity is important, the arrangement of FIG. 5, where the operative controls (such as the gain and tone controls of the system) are positioned between the dynamic range modifier and the utilization means, is to be preferred.

If response time and fidelity are not critical, the control circuit 17 of FIG. 1 could be energized by the electrical signal appearing at the output of the power amplifier (83 in FIG. 5, 97 in FIG. 6) rather than by the signal appearing at input terminal 3. In this case, the input terminal 21 would be disconnected from terminal 3 and a conductor would be provided to connect the output of the power amplifier (83 or 97) to terminal 21. Such an arrangement would, while producing rather unpredictable nonlinearities because of the resulting loop-type feedback, advantageously provide a higher level signal to energize control circuit 17 than that present at terminal 3.

In view of the above, it will be seen that the several objects of the invention are achieved and other advantageous results attained.

Various changes could be made in the above constructions without departing from the scope of the invention. For example, switch 7 could be provided with a "by-pass" or disabling position for directly connecting input terminal 3 with output terminal 5 to make possible the selective removal of network 2 from the path of the signal in an audio-frequency amplifying system. It is intended, therefore, that all of the matter contained in the above description or shown in the accompanying drawings shall be interpreted as illustrative and not in a limiting sense.

What is claimed is:

1. Apparatus for modifying the dynamic range of an electrical signal comprising:

a first electrical circuit through which said electrical signal is conducted, said circuit having an input circuit and an output circuit including an output resistance, an incandescent source of luminous energy, a second electrical circuit having an input circuit to which said electrical signal is applied, said second electrical circuit having an output circuit connected to said source for variably controlling the intensity of the luminous energy radiated by said source as a generally smooth continuous function of the amplitude level of said electrical signal over a substantial range of amplitude levels thereof, a light-sensitive resistor positioned in light-receiving relationship with said source, said light-sensitive resistor having a resistance which varies as a function of the intensity of the luminous energy impinging thereon, said light-sensitive resistor being connected in said first electrical circuit to vary the conductivity thereof as a function of said intensity, and a switch having first and second positions connected in said first electrical circuit and adapted, when in said first position, to place said light-sensitive resistor in parallel with said output resistance and, when in said second position, to place said light-sensitive resistor in series with said output resistance, whereby said electrical circuits function, with said switch in said first position, to compress the dynamic range of the electrical signal conducted through said first electrical circuit and, with said switch in said second position, to expand the dynamic range of the electrical signal conducted through said first electrical circuit.

2. Apparatus as set forth in claim 1 in which said second electrical circuit includes means for amplifying the electrical signal applied to the input circuit of said second electrical signal, said amplifying means being interconnected between the input and output circuits of said second electrical circuit, and said second electrical circuit further includes means for varying the amount of compression or expansion caused by said electrical circuits.

3. Apparatus for modifying the dynamic range of an electrical signal comprising:

a first electrical circuit through which said electrical signal is conducted, said circuit having an input circuit and an output circuit including an output resistance, an incandescent source of luminous energy, a second electrical circuit having an input circuit to which said electrical signal is applied, said second electrical circuit having an output circuit connected to said source for variably controlling the intensity of the luminous energy radiated by said source as a generally smooth continuous function of the amplitude level of said electrical signal over a substantial range of amplitude levels thereof, a light-sensitive resistor positioned in light-receiving relationship with said source, said light-sensitive resistor having a resistance which varies as a function of the intensity of the luminous energy impinging thereon, said light-sensitive resistor being shunt-connected across said output resistance thereby to vary the conductivity of said first electrical circuit as a function of said intensity wherein the conductivity of said network is greater for low amplitude signals than for higher amplitude signals, whereby the dynamic range of the electrical signal appearing at the output circuit of said first electrical circuit is compressed relative to that of the electrical signal applied to the input circuit of said first electrical circuit.

4. Apparatus as set forth in claim 3 wherein said second electrical circuit includes means for amplifying the electrical signal applied to the input circuit of said second electrical circuit, said amplifying means being interconnected between the input and output circuits of said second electrical circuit, and said second electrical circuit further includes means connected with said input circuit thereof for adjustably varying the amount of dynamic range compression.

5. Apparatus as set forth in claim 3 in which said second electrical circuit further includes a biasing means for establishing a threshold current through the filament of said incandescent luminous energy source and a corresponding threshold illumination level of said source, said biasing means comprising a resistance interconnected between a source of D.C. power and said filament.

6. Apparatus for modifying the dynamic range of an electrical signal comprising:

a first electrical circuit through which said electrical signal is conducted, said circuit having an input circuit and an output circuit including an output resistance, an incandescent source of luminous energy, a second electrical circuit having an input circuit to which said electrical signal is applied, said second electrical circuit having an output circuit connected to said source for variably controlling the intensity of the luminous energy radiated by said source as a generally smooth continuous function of the amplitude level of said electrical signal over a substantial range of amplitude levels thereof, a light-sensitive resistor positioned in light-receiving relationship with said source, said light-sensitive resistor having a resistance which varies as a function of the intensity of the luminous energy impinging thereon, said light-sensitive resistor being serially connected with said output resistance thereby to vary the conductivity of said first electrical circuit as a function of said intensity, wherein the conductivity of said network is less for low amplitude signals than for higher amplitude signals, whereby the dynamic range of the electrical signal appearing at the output circuit of said first electrical circuit is expanded relative to that of the electrical signal applied to the input circuit of said first electrical circuit.

7. Apparatus as set forth in claim 6 wherein said second electrical circuit includes means for amplifying the electrical signal applied to the input circuit of said second electrical circuit, said amplifying means being interconnected between the input and output circuits of said second electrical circuit, and said second electrical circuit further includes means connected with said input circuit thereof for adjustably varying the amount of dynamic range expansion.

8. Apparatus as set forth in claim 6 in which said second electrical circuit further includes a biasing means for establishing a threshold current through the filament of said incandescent luminous energy source and a corresponding threshold illumination level of said source, said biasing means comprising a resistance interconnected between a source of D.C. power and said filament.

9. In a system for amplifying an audio-frequency electrical signal, said system including a preamplifier and a power amplifier, apparatus for modifying the dynamic range of said audio-frequency signal comprising:

a first electrical circuit adapted to be connected in said system for attenuating said audio-frequency signal, said circuit having an input circuit and an output circuit including an output resistance, an incandescent source of luminous energy, a second electrical circuit having an input circuit connected to the input circuit of said first electrical circuit and including means for amplifying the audio-frequency signal applied thereto, said second electrical circuit having an output circuit connected to said source for variably controlling the intensity of the luminous energy radiated by said source as a generally smooth continuous function of the amplitude level of said audio-frequency signal over a substantial range of amplitude levels thereof, said second electrical circuit further including a biasing means for establishing a threshold current through the filament of said incandescent luminous energy source and a corresponding threshold illumination level of said source, a light-sensitive resistor positioned in light-receiving relationship with said source, said light-sensitive resistor having a resistance which varies as a function of the intensity of the luminous energy impinging thereon, said light-sensitive resistor being connected in said first electrical circuit to vary the amount of attenuation introduced thereby as a function of said intensity, a switch having first and second positions connected in said first electrical circuit and adapted, when in said first position, to place said light-sensitive resistor in parallel with said output resistance and, when in said second position, to place said light-sensitive resistor in series with said output resistance, whereby said electrical circuits function, with said switch in said first position, to compress the dynamic range of the electrical signal conducted through said first electrical circuit and, with said switch in said second position, to expand the dynamic range of the electrical signal conducted through said first electrical circuit, said second electrical circuit including means for adjustably varying the amount of dynamic range modification.

10. In an audio-frequency amplifying system as set forth in claim 9, said apparatus further including means for connecting the output circuit of said first electrical circuit to said preamplifier.

11. In an audio-frequency amplifying system as set forth in claim 9, said first electrical circuit being connected between said preamplifier and said power amplifier.

References Cited by the Examiner

UNITED STATES PATENTS

| | | | |
|---|---|---|---|
| 1,855,863 | 4/32 | McCreary | 330—59 |
| 2,964,685 | 12/60 | Raymond | 250—209 X |
| 3,020,488 | 2/62 | De Miranda et al. | 330—59 |
| 3,040,262 | 6/62 | Pearson | 330—59 X |
| 3,072,795 | 1/63 | Badmaieff | 330—59 X |
| 3,082,381 | 3/63 | Morrill et al. | 330—59 |
| 3,087,120 | 4/63 | Schoellhorn et al. | 330—59 |

ROY LAKE, *Primary Examiner.*

NATHAN KAUFMAN, *Examiner.*